(12) United States Patent
Choi et al.

(10) Patent No.: US 7,372,261 B2
(45) Date of Patent: *May 13, 2008

(54) PRINTED CIRCUIT BOARD INTEGRATED WITH A TWO-AXIS FLUXGATE SENSOR AND METHOD FOR MANUFACTURING THE SAME

(75) Inventors: Won-youl Choi, Suwon (KR); Sang-on Choi, Suwon (KR); Jun-sik Hwang, Osan (KR); Myung-sam Kang, Choongchungnam-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 156 days.

This patent is subject to a terminal disclaimer.

(21) Appl. No.: 10/629,614

(22) Filed: Jul. 30, 2003

(65) Prior Publication Data

US 2004/0027121 A1    Feb. 12, 2004

(30) Foreign Application Priority Data

Jul. 30, 2002    (KR) ...................... 10-2002-0045069

(51) Int. Cl.
*G01R 33/04* (2006.01)
(52) U.S. Cl. ...................................... 324/253; 324/249
(58) Field of Classification Search ................ 324/249, 324/253, 258
See application file for complete search history.

(56) References Cited

U.S. PATENT DOCUMENTS 4,864,238 A    9/1989    Seitz 5,757,184 A    5/1998    Kurihara et al.

(Continued)

FOREIGN PATENT DOCUMENTS

JP    08-179023    7/1996

(Continued)

OTHER PUBLICATIONS

Kawahito, et al. "High-resolution micro-fluxgate sensing elements using closely coupled coil structures", Sensors and Actuators A, vol. 54, No. 1-3, pp. 612-617, Elsevier Sequoia S.A. Lausanne, CH (Switzerland), (Jun. 1996).

(Continued)

*Primary Examiner*—Reena Aurora
*Assistant Examiner*—David M. Schindler
(74) *Attorney, Agent, or Firm*—Lee & Morse, P.C.

(57) ABSTRACT

A printed circuit board integrated with a two-axis fluxgate sensor includes a first soft magnetic core formed lengthwise in a first axial direction, a first excitation coil formed of a metal film and wound around the first soft magnetic core, a first pick-up coil formed of a metal film and wound around the first soft magnetic core and the first excitation coil, a second soft magnetic core formed lengthwise in a second axial direction, the second axial direction being perpendicular to the first axial direction, a second excitation coil formed of a metal film and wound around the second soft magnetic core, a second pick-up coil formed of a metal film and wound around the second soft magnetic core and the second excitation coil, and a pad for establishing conductivity between the first and second excitation coils and the first and second pick-up coils and an external circuit.

17 Claims, 12 Drawing Sheets

U.S. PATENT DOCUMENTS

| | | | |
|---|---|---|---|
| 6,100,694 A * | 8/2000 | Wong | 324/318 |
| 6,251,834 B1 * | 6/2001 | Glowacki et al. | 505/239 |
| 6,407,547 B1 | 6/2002 | Yamada et al. | |
| 6,411,086 B1 * | 6/2002 | Choi et al. | 324/253 |
| 6,690,164 B1 * | 2/2004 | Fedeli et al. | 324/253 |
| 2003/0169037 A1 * | 9/2003 | Kang et al. | 324/253 |

FOREIGN PATENT DOCUMENTS

| | | |
|---|---|---|
| JP | 09-152473 | 6/1997 |
| JP | 09-318720 | 12/1997 |
| WO | WO 01/44826 A1 | 6/2001 |

OTHER PUBLICATIONS

Kawahito, et al. "A 2-D CMOS Microfluxgate Sensor System for Digital Detection of Weak Magnetic Fields", IEEE Journal of Solid-State Circuits, vol. 34, No. 12, pp. 1843-1851, IEEE Inc., New York, US, (Dec. 1999).

* cited by examiner

▨ EXCITATION COIL
▨ SOFT MAGNETIC CORE
▢ PICK-UP COIL

PRINTED CIRCUIT BOARD INTEGRATED WITH A TWO-AXIS FLUXGATE SENSOR AND METHOD FOR MANUFACTURING THE SAME

BACKGROUND OF THE INVENTION

1. Field of the Invention

The present invention generally relates to a printed circuit board. More particularly, the present invention relates to a printed circuit board integrated with a two-axis fluxgate sensor and a method for manufacturing the same.

2. Description of the Related Art

The existence of magnetic energy has been proven through various physical phenomena. For example, a fluxgate sensor enables a human to indirectly perceive magnetic energy, since magnetic energy is not perceivable by human sense organs, such as eyes or ears. Regarding a fluxgate sensor, a magnetic sensor employing a soft magnetic coil has been conventionally used. A magnetic sensor is made by winding a coil around a relatively large bar-shaped core or annular-shaped core, which is formed of a soft magnetic ribbon. In addition, an electronic circuit is employed to obtain a magnetic field in proportion to the measured magnetic field.

The conventional fluxgate sensor, however, has the following problems, some of which are due to the structure of the conventional fluxgate sensor. In the structure of a conventional fluxgate sensor the coil being wound around the large bar-shaped core or annular-shaped core, which is made of the soft magnetic ribbon, results in high production costs and a large volume of the overall system.

In addition, flux leakage is inevitable in the flux change due to the excitation coil and the detected magnetic field. Accordingly, high sensitivity is not readily achieved.

Further, a conventional fluxgate sensor for detecting magnetic energy in two axes includes two separate one-axis fluxgate sensors arranged in perpendicular relation with each other, which results in yet another problem of the device size increasing.

SUMMARY OF THE INVENTION

It is a feature of an embodiment of the present invention to provide a printed circuit board integrated with a compact-sized two-axis fluxgate sensor capable of detecting magnetic field in two axes with high accuracy.

Another feature of an embodiment of the present invention is to prevent an induction wave in a flux change detecting coil when the external magnetic field is measured as zero (0).

The above features are provided by a printed circuit board integrated with a two-axis fluxgate sensor according to an embodiment of the present invention, including a first soft magnetic core formed lengthwise in a first axial direction; a first excitation coil formed of a metal film and wound around the first soft magnetic core; a first pick-up coil formed of a metal film and wound around the first soft magnetic core and the first excitation coil; a second soft magnetic core formed lengthwise in a second axial direction, the second axial direction being perpendicular to the first axial direction; a second excitation coil formed of a metal film and wound around the second soft magnetic core; a second pick-up coil formed of a metal film and wound around the second soft magnetic core and the second excitation coil; and a pad for establishing conductivity between the first and second excitation coils and the first and second pick-up coils and an external circuit.

Preferably, the first and second soft magnetic cores either include two parallel bars or a rectangular-ring formed on a same plane. Preferably, the first and second excitation coils have a structure of winding the two bars, or winding both sides of the rectangular-ring in an axial direction respectively, and substantially in a solenoid pattern. Alternatively, the first and second excitation coils may have a structure of winding the two bars, or winding both sides of the rectangular-ring in an axial direction alternately and substantially in a figure-eight pattern. Preferably, the first and second pick-up coils have a structure of winding the two bars, or winding both sides of the rectangular-ring in an axial direction together, and substantially in a solenoid pattern. Alternatively, the first and second pick-up coils may have a structure of winding the two bars, or winding both sides of the rectangular-ring in an axial direction respectively, and substantially in a solenoid pattern.

The first and second excitation coils and the first and second pick-up coils may wind around the two bars or the rectangular-ring in an alternating fashion. Although the number of windings of the first and second excitation coils and the first and second pick-up coils is not limited, it is preferred that the first and second excitation coils and the first and second pick-up coils are each wound once. In the case that the first and second excitation coils and the first and second pick-up coils are wound once, the first and second excitation coils and the first and second pick-up coils are preferably wound substantially in a zigzag fashion, such that the first and second excitation coils and the first and second pick-up coils face each other with the intervention of the two bars, or the rectangular-ring, therebetween.

The above features are also provided by a method for manufacturing a printed circuit board integrated with a two-axis fluxgate sensor according to the present invention, including: (a) forming lower patterns of excitation coils and pick-up coils on both sides of a first substrate, wherein the first substrate is formed by stacking a metal film on both sides of a dielectric substance; (b) sequentially stacking a prepreg and a soft magnetic substance film on each of the lower patterns of the excitation coils and the pick-up coils; (c) forming soft magnetic cores on each of the soft magnetic substance films, the soft magnetic cores on the soft magnetic substance films being in perpendicular relation; (d) forming a second substrate by sequentially stacking a prepreg and a metal film on each side of the soft magnetic cores; (e) forming upper patterns of the excitation coils and the pick-up coils on each of the metal films stacked on both sides of the second substrate, each of the upper patterns corresponding to a respective one of the lower patterns that is formed at the same side as the respective one of the upper patterns; (f) forming through holes from the upper patterns to the lower patterns formed on each of the metal films on both sides of the second substrate; (g) plating both sides of the second substrate where the through holes are formed; (h) etching the plated sides of the second substrate so that the excitation coils and the pick-up coils are separately formed on both sides with respective winding structures; and (i) forming a pad for establishing conductivity between the excitation coils and the pick-up coils and an external circuit.

Preferably, the soft magnetic cores formed on both sides of the second substrate either include two parallel bars formed on a same plane or a rectangular-ring formed on a same plane. Preferably, the excitation coils have a structure of winding the two bars, or winding both sides of the rectangular-ring in an axial direction, respectively, and substantially in a solenoid pattern. Alternatively, the excitation coils may have a structure of winding the two bars, or winding both sides of the rectangular-ring in an axial direction alternately, and substantially in a figure-eight pattern. Preferably, the pick-up coils have a structure of winding the two bars, or winding both sides of the rectangular-ring in an axial direction together, and substantially in a solenoid pattern. Alternatively, the pick-up coils may have a structure of winding the two bars or winding both sides of the rectangular-ring in an axial direction respectively, and substantially in a solenoid pattern.

The excitation coils and the pick-up coils may wind around the two bars, or the rectangular-ring, in an alternating fashion. Although the number of winding of the excitation coils and the pick-up coils is not limited, it is preferred that the excitation coils and the pick-up coils are each wound once. In the case that the excitation coils and the pick-up coils are wound once, the excitation coils and the pick-up coils are preferably wound substantially in a zigzag fashion, such that the excitation coils and the pick-up coils face each other with the intervention of the two bars, or the rectangular-ring therebetween.

According to an embodiment of the present invention, the method may further include etching the metal films stacked on both sides of the second substrate to a predetermined thickness prior to forming the upper pattern of the excitation coil and the pick-up coil.

In addition, each of the stages in the method may include applying a photosensitive agent on a predetermined surface; light-exposing according to a predetermined shape; and etching a predetermined location according to the light exposure.

According to the present invention, since the two-axis fluxgate sensor is integrated in the printed circuit board, greater compactness of the product may be achieved, while facilitating detection of the magnetic fields in two axes with higher accuracy. Further, no induction voltage occurs in the pickup coils when the external magnetic field is measured as zero (0). Also according to the present invention, various applications are possible through the integration with other types of sensors and external circuits.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
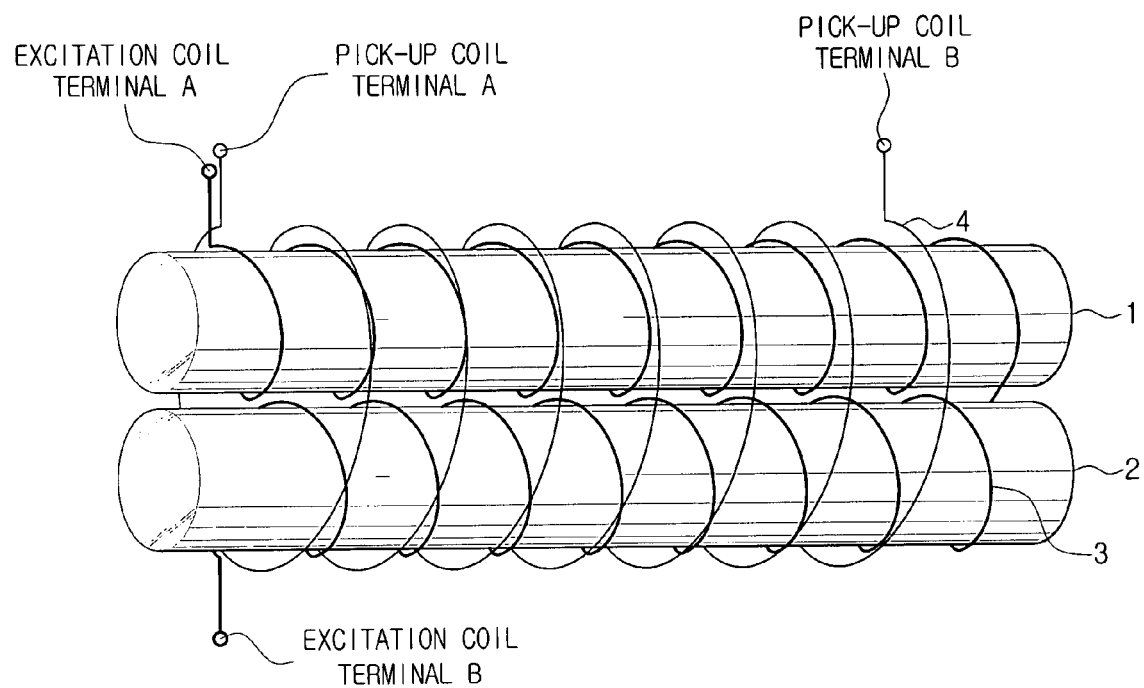
FIG. 1 illustrates a diagram of a fluxgate sensor according to a preferred embodiment of the present invention.

Korean Patent Application No. 2002-45069, filed on Jul. 30, 2002, and entitled: "Printed Circuit Board Integrated with a Two-Axis Fluxgate Sensor and Method for Manufacturing the Same," is incorporated by reference herein in its entirety.

The present invention will now be described in greater detail by referring to the appended drawings. Like reference numerals indicate like elements throughout.

FIG. 1 illustrates a view of a fluxgate sensor integrated into a printed circuit board according to a preferred embodiment of the present invention.

The fluxgate sensor has first and second bar-type soft magnetic cores 1 and 2 with an excitation coil 3 being separately wound thereon, and a pick-up coil 4 wound around the first bar-type soft magnetic core 1 and the second bar-type soft magnetic core 2 substantially in a solenoid pattern. Hereinafter, the winding structure, in which the excitation coil 3 is separately wound around the first and second bar-type soft magnetic cores, will be called a "separated structure." Alternatively, the fluxgate sensor may also have a winding structure in which the excitation coil 3 is alternately wound around the two parallel bar-type cores, i.e., the first and second soft magnetic cores 1 and 2 are alternately wound around with the excitation coil 3 substantially in a figure-eight pattern. This structure will be referred to as a "united structure." The pick-up coil 4 can either wind the first and second soft magnetic cores 1 and 2 in a solenoid pattern or as in the separated structure. Further, the first and second soft magnetic cores 1 and 2 may be replaced with a rectangular-ring type core.

Figure 2A:
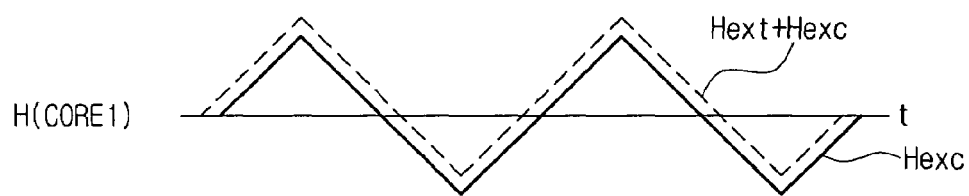
FIGS. 2A through 2F are waveforms for explaining the operation of the fluxgate sensor of FIG. 1.
Figure 2B:
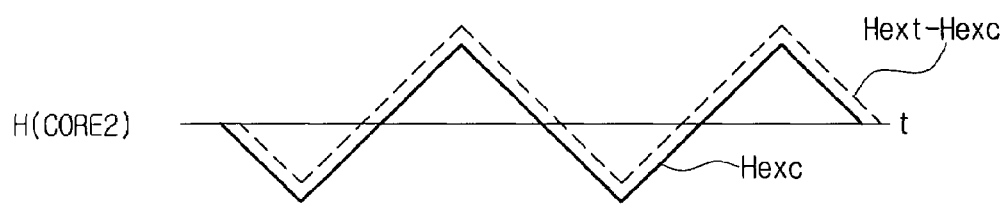
Figure 2C:
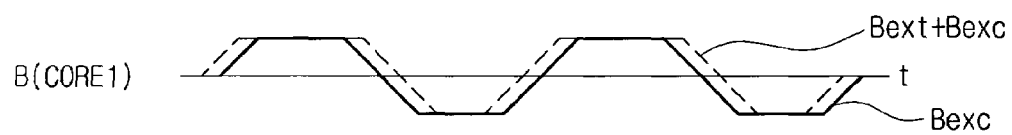
Figure 2D:
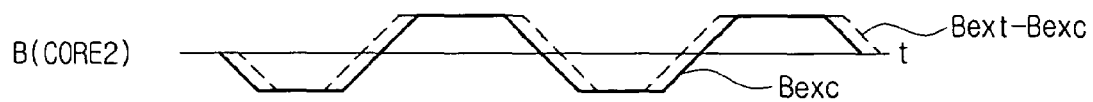
Figure 2E:
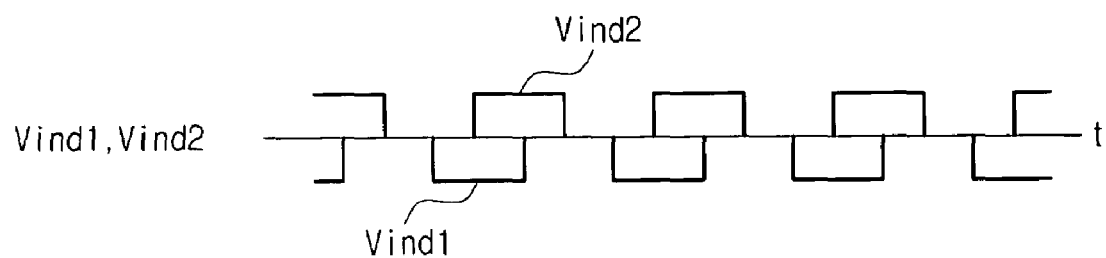
Figure 2F:
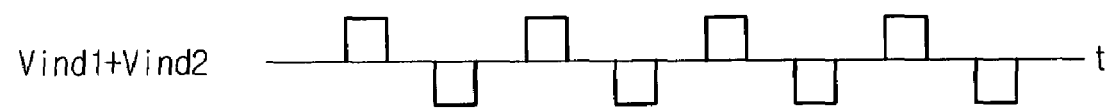

FIGS. 2A through 2F are waveforms for explaining the operation of the fluxgate sensor of FIG. 1. FIG. 2A is a waveform of the magnetic field H generated from the first soft magnetic core 1. FIG. 2B is a waveform of the magnetic field H generated from the second soft magnetic core 2. FIG. 2C is a waveform of the flux density B generated from the first soft magnetic core 1. FIG. 2D is a waveform of the flux density B generated from the second soft magnetic core 2. FIGS. 2E and 2F are waveforms of first and second voltages Vind1 and Vind2 induced at the pick-up coil 4, and the sum of first and second voltages (Vind1+Vind2), respectively.

With the excitation coil 3 and the pick-up coil 4 being wound around the two bar-type soft magnetic cores 1 and 2, by the excited current of the alternating current, the internal magnetic field H of the first bar 1 is represented as 'Hext (external magnetic field)+Hexc (magnetic field by excitation coil).' The internal magnetic field H of the second bar 2 is represented as 'Hext−Hexc'. The flux density B of the first bar 1 is represented as 'Bext (flux density by external flux)+Bexc (flux density by excitation coil)', and the flux density B of the second bar 2 is represented as 'Bext−Bexc'. Thus, as may be seen from FIGS. 2A-2D, the magnetic field and flux density of first and second bars 1 and 2 are generated in opposite directions.

The voltages Vind1 and Vind2 induced at the respective bars 1 and 2 and detected at the pick-up coil 4 are represented as shown in FIG. 2E. Since the pick-up coil 4 is wound to gain the sum of the flux changes at the two bars 1 and 2, the actual voltage detected at the pick-up coil 4 is represented as shown in FIG. 2F, in which the two voltages are offset with respect to one another. In other words, from the direction of the axis of the respective bars 1 and 2, the external flux Hext is applied in the same direction with respect to the two bars 1 and 2. Therefore, by the excited magnetic field Hexc, the internal fluxes of the two bars 1 and 2 are represented as 'Hext +Hexc' and 'Hext−Hexc,' respectively. Also, by the internal magnetic fields of the respective bars 1 and 2, voltages of Vind1 and Vind2 (FIG. 2E) are induced at the pick-up coil 4, and thus, the size of the external magnetic field Hext is obtained by measuring the respective voltages Vind1 and Vind2.

An important consideration in the above-described fluxgate sensor is the winding structure of the excitation coil 3 and the pick-up coil 4. The structure is important because the sum of the flux changes at the respective bars 1 and 2 is gained by alternately winding the excitation coil 3 and the pick-up coil 4 on the same plane. The structure of the fluxgate sensor described above offsets the induction waves of the magnetic field generated from the first and second bar-type soft magnetic cores 1 and 2 in the absence of the external magnetic field Hext, with the flux generated by the excitation coil forming a closed-magnetic path at the bar-type soft magnetic cores 1 and 2. It is preferable that the excitation coil 3 and the pick-up coil 4 are alternately wound one time, although the number of winding can be varied up to several times.

Detection of the magnetic field is possible simply by arranging the excitation coil 3 and the pick-up coil 4 on a single soft magnetic core. In this case, an induction voltage is generated at the pick-up coil 4 even in the absence of the external magnetic field 'Hext' due to the excitation coil 3, thus requiring complicated signal processing of the output signal from the pick-up coil 4, such as amplification and filtering. Accordingly, instead of using a single core, it is more advantageous in the signal processing to use two cores or a rectangular-ring type core.

Figure 3:
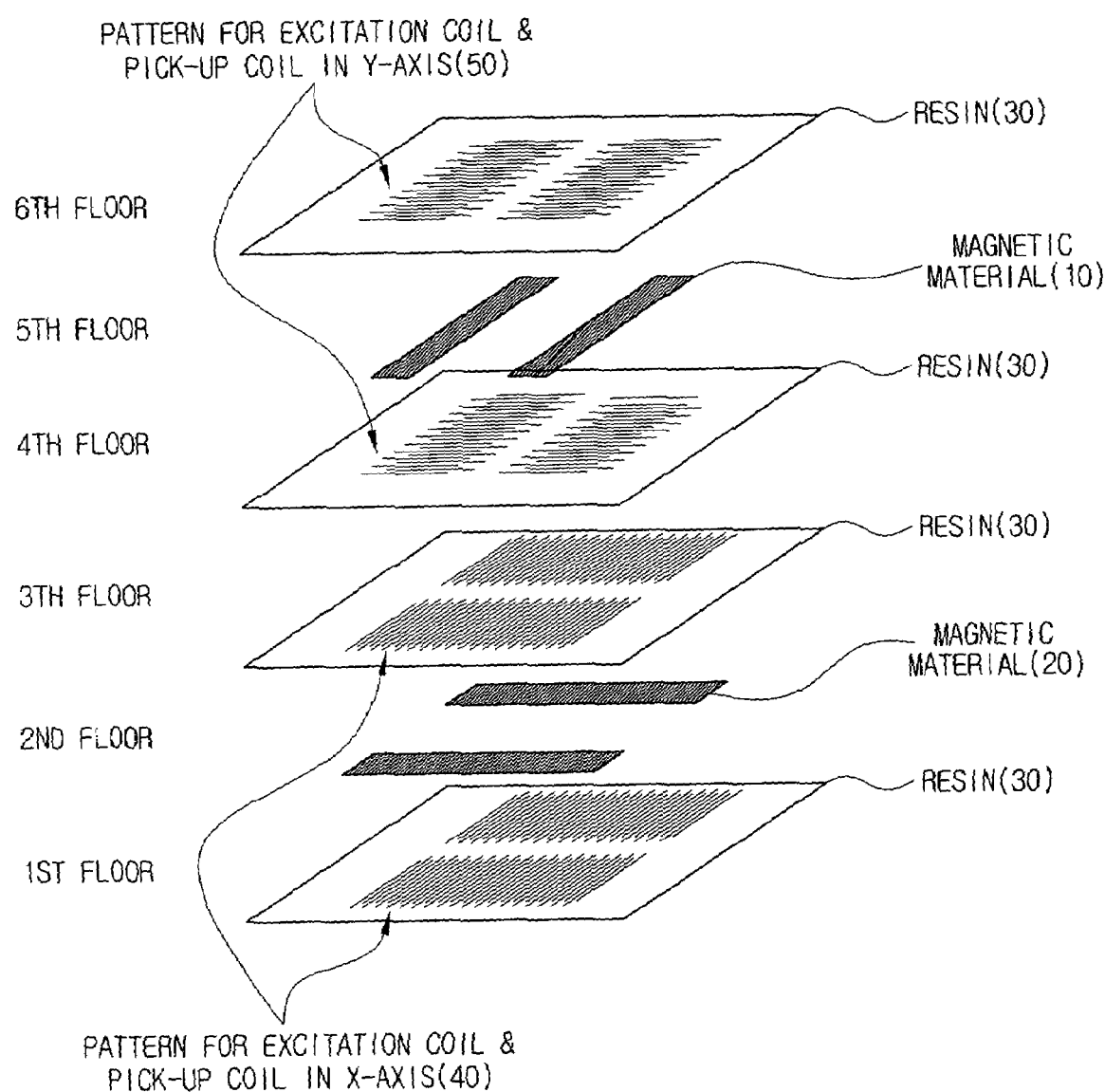
FIG. 3 illustrates a view of the printed circuit board integrated with the two-axis fluxgate sensor according to a preferred embodiment of the present invention, showing each floor of the printed circuit board.

FIG. 3 is a schematic exploded perspective view of a printed circuit board (PCB) integrated with a two-axis fluxgate sensor according to an embodiment of the present invention. As shown in FIG. 3, the two-axis fluxgate sensor is constructed of two single-axis fluxgate sensors that are stacked on each other in a perpendicular relation. Upper and lower patterns 40 of the excitation coil 3 and the pick-up coil 4 are formed on an epoxy resin 30 from the first (i.e., lowest) floor to the third floor, with the two bar-type soft magnetic cores formed of magnetic material 20 being extended on the second floor in a direction of the x-axis. Lower and upper patterns 50 of the excitation coil 3 and the pick-up coil 4 are formed on an epoxy resin 30 from the fourth to the sixth (i.e., highest) floors, with the two soft magnetic cores of magnetic material 10 are extended on the fifth floor in a direction of the y-axis. The present invention offers an advantage of compact size as the sensors are integrated into the PCB.

Figure 4A:
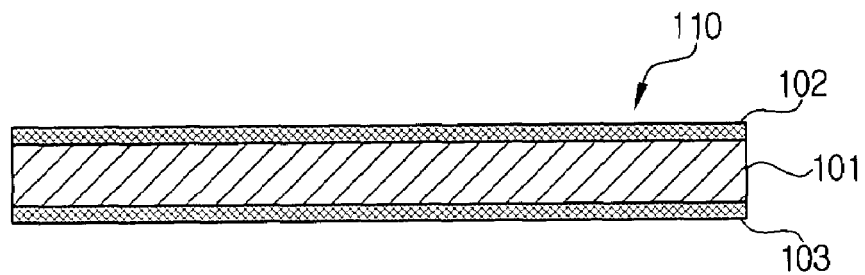
FIGS. 4A through 4L illustrate sectional views showing stages in the manufacturing process of the printed circuit board.
Figure 4B:
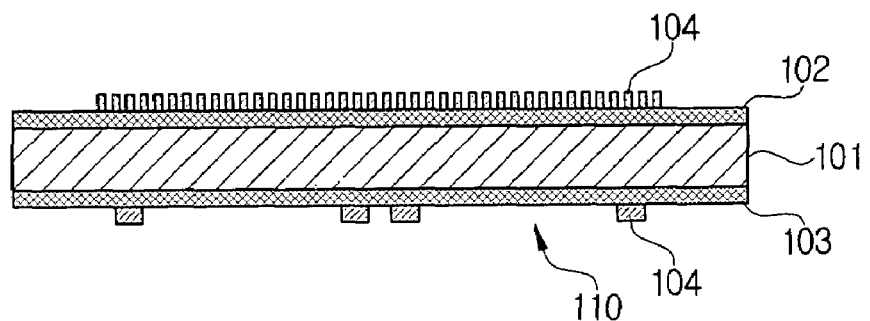
Figure 4C:
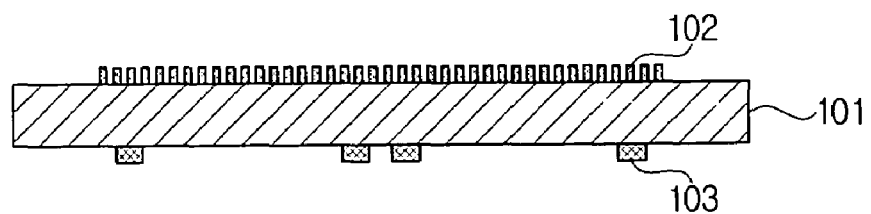
Figure 4D:
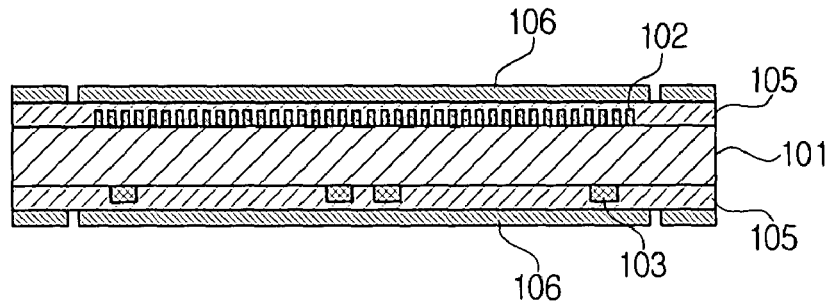
Figure 4E:
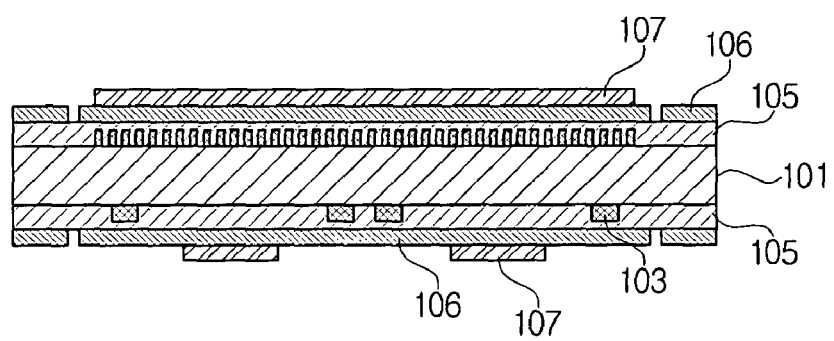
Figure 4F:
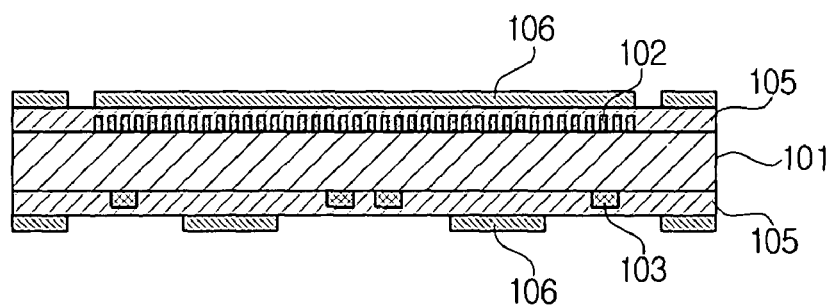
Figure 4G:
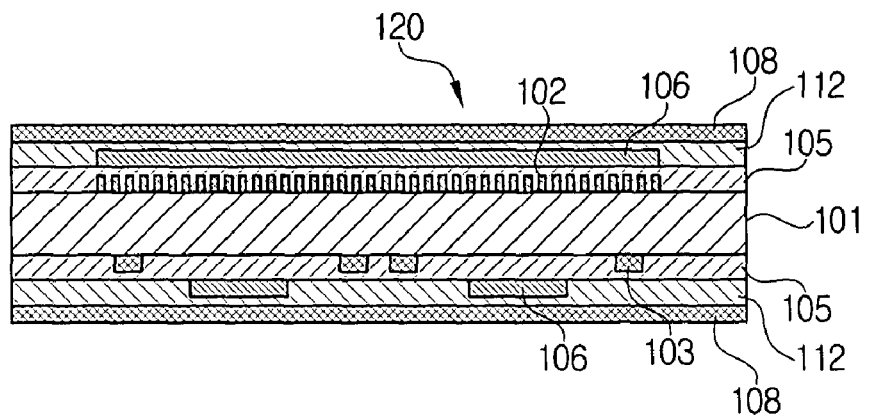
Figure 4H:
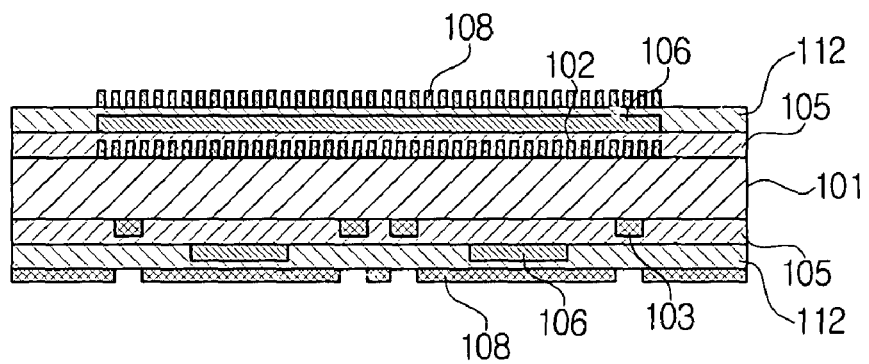
Figure 4I:
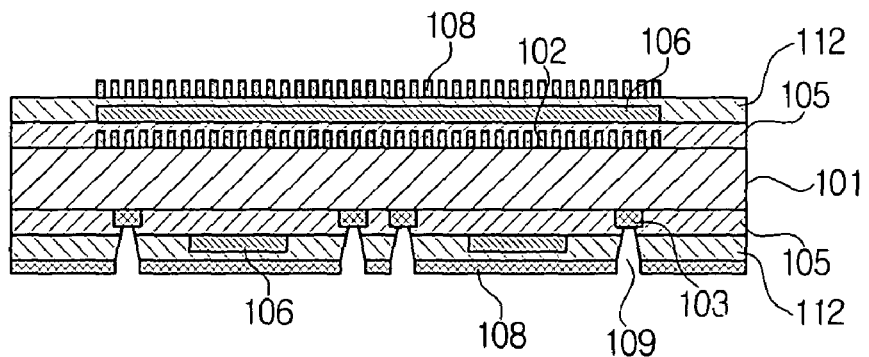
Figure 4J:
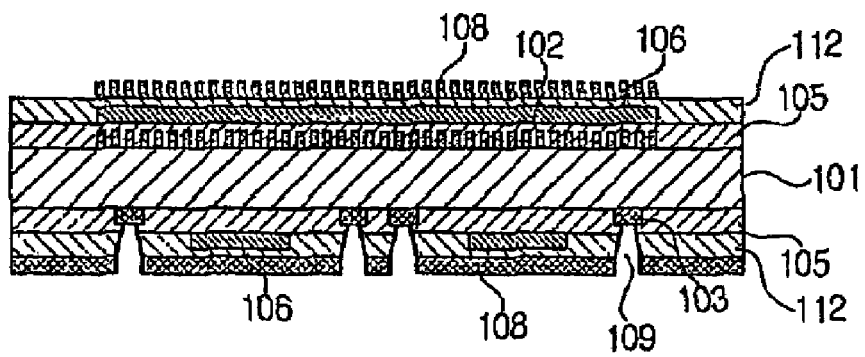
Figure 4K:
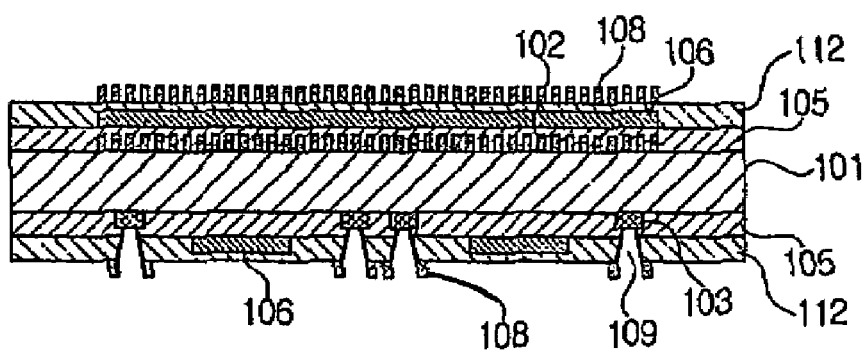
Figure 4L:
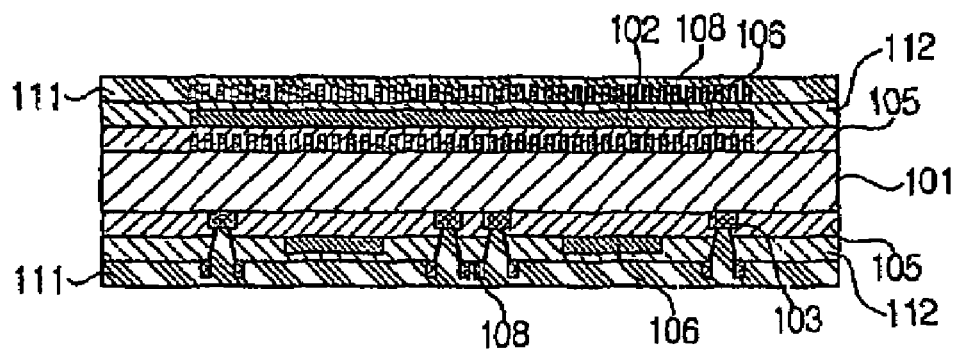

FIGS. 4A through 4L illustrate sectional views depicting stages in the manufacturing process of the two-axis fluxgate sensor integrated in the PCB. Referring to FIG. 4A, in order to manufacture the two-axis fluxgate sensor according to an embodiment of the present invention, first, a photoresist is applied on both sides of a first substrate, which is preferably a copper clad laminate (CCL) board 110. The CCL board is constructed of metal films 102 and 103 stacked on both sides of a dielectric substance 101. Referring to FIGS. 4B and 4C, the CCL board 110 is then subjected to light exposure and development, and then the lower pattern 104 of the excitation coil 3 and the pick-up coil 4 is formed through etching and surface processing. As a result, the third and fourth floors of FIG. 3 are formed. Next, referring to FIG. 4D, a first prepreg 105 and a soft-magnetic substance layer 106 are sequentially stacked on both sides of the CCL board 110, where the lower pattern of the excitation coil 3 and the pick-up coil 4 are formed. Then, referring to FIG. 4E, the photoresist 107 is applied on the soft-magnetic substance layer 106 on both sides, and light exposure and development are carried out. Referring to FIG. 4F, the soft magnetic cores on different floors in perpendicular relation are formed through etching and surface processing. As a result, the second and fifth floors shown in FIG. 3 are formed. Next, referring to FIG. 4G, the first prepreg 105, a second prepreg 112, and a metal film 108 are sequentially stacked on the upper side of the soft magnetic cores, forming a second substrate 120. Then, referring to FIG. 4H, the metal film 108 stacked on both sides of the second substrate 120 is subjected to half-etching. Continuously, by applying, light-exposing and developing a photoresist on the metal films 108, the upper pattern of the excitation coil 3 and the pick-up coil 4 corresponding to the lower pattern is formed. Subsequently, referring to FIGS. 4I and 4J, a through hole 109 is formed to open communication of upper and lower patterns of the excitation coil 3 and the pick-up coil 4 formed on the metal films on both sides of the second substrate 120, and then both sides of the second substrate 120 are plated. Next, referring to FIG. 4K, the photoresist is applied on both plated sides to have the upper pattern of the excitation coil 3 and the pick-up coil 4 separately have winding structures, and the process of light exposure, developing, etching and surface processing are performed. As a result, the first and sixth floors of FIG. 2 are formed. Referring now to FIG. 4L, a pad 111 for establishing conductivity with the external circuit is formed through general processes, and the outer shape is processed.

Figure 5A:
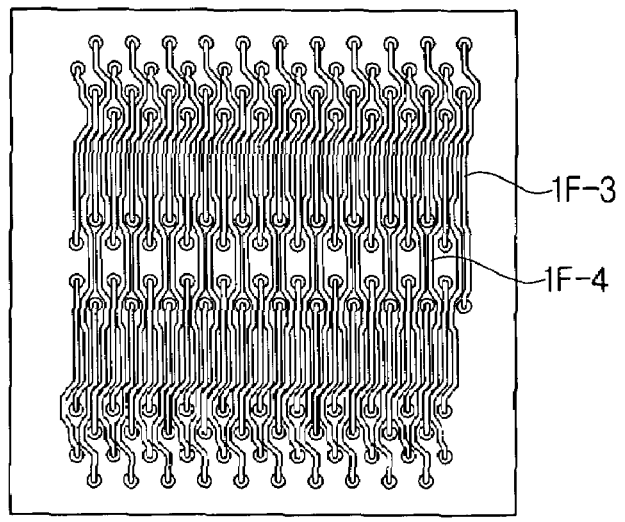
FIGS. 5A through 5F illustrate plan views showing each floor of a printed circuit board according to another embodiment of the present invention.
Figure 5B:
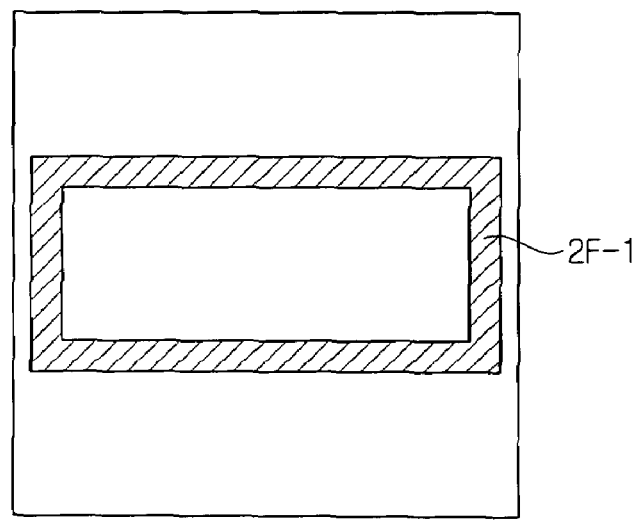
Figure 5C:
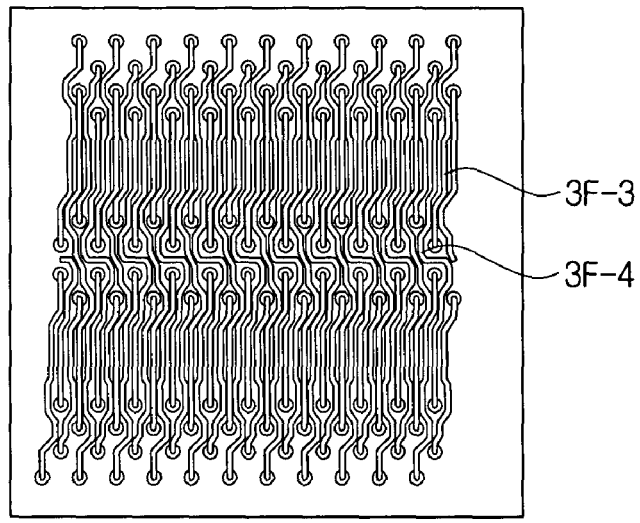
Figure 5D:
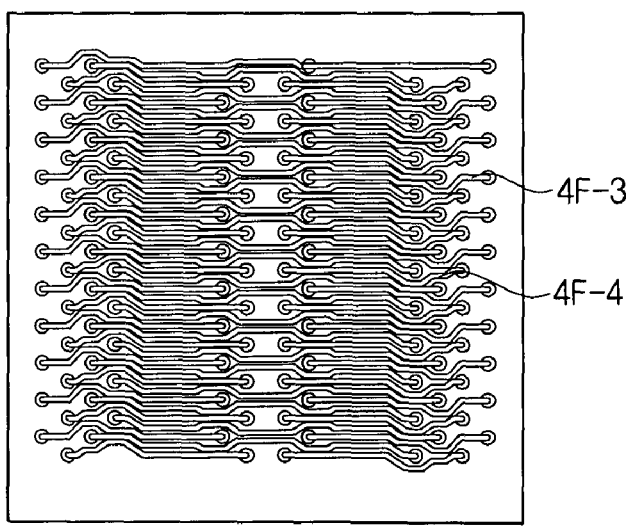
Figure 5E:
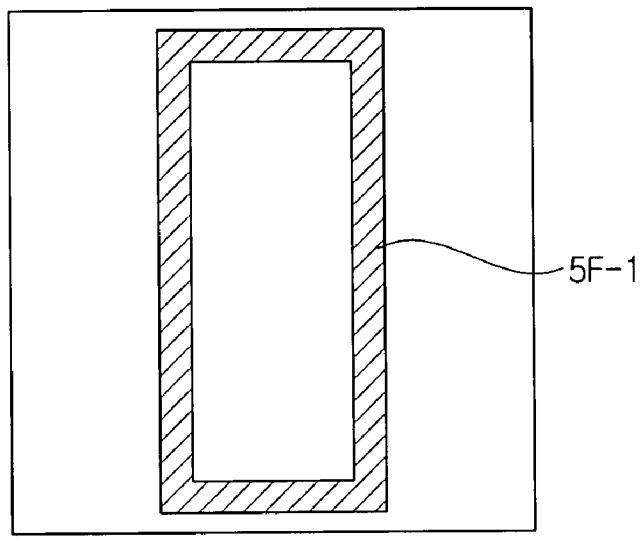
Figure 5F:
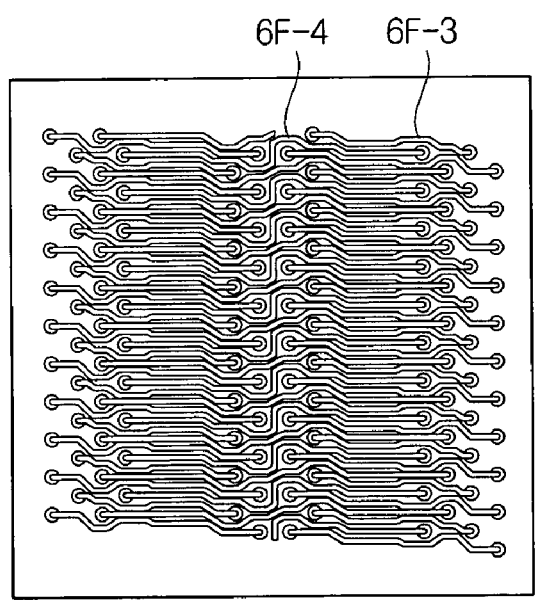

FIG. 5A through 5F illustrate plan views of each floor of the two-axis fluxgate sensor according to another embodiment of the present invention, showing an upper pattern of the excitation coil 3 and the pick-up coil 4 formed on the same plane for detecting the magnetic field in the direction of the x-axis. Referring to FIG. 5A, among the two adjacent lines, the shorter lines 1F-3 represent the upper pattern of the excitation coil 3 wound around the soft magnetic core in the separated structure, while the longer lines 1F-4 represent the upper pattern of the pick-up coil 4 wound around the soft magnetic core. FIG. 5B illustrates a plane view of the second floor, showing the soft magnetic core 2F-1 extended lengthwise in the direction of the x-axis to detect the magnetic field in the direction of the x-axis. By way of distinction, while FIG. 3 represents the respective soft magnetic cores 10 and 20 as bar type, the cores 10 and 20 will be depicted as rectangular-ring type in this embodiment. FIG. 5C illustrates a plan view of the third floor, showing the lower pattern of the excitation coil 3F-3 and the pick-up coil 3F-4 formed to correspond to those of FIG. 5A. FIG. 5D illustrates a plan view of the fourth floor, showing the lower pattern of the excitation coil 4F-3 and the pick-up coil 4F-4 formed on the same plane in order to detect a magnetic field in the direction of the y-axis. FIG. 5E illustrates a plan view of the fifth floor, showing the rectangular-ring type soft magnetic core 5F-1 lengthwise extended in the direction of the y-axis to detect a magnetic field in the direction of the y-axis. FIG. 5F illustrates a plan view of the sixth floor, showing the upper pattern of the excitation coil 6F-3 and the pick-up coil 6F-4 formed to correspond to the lower portion of the excitation coil 4F-3 and the pick-up coil 4F-4.

As shown in FIGS. 5A through 5F, the respective floors are constructed to form a two-axis fluxgate sensor for detecting magnetic fields in the direction of both the x- and y-axes, with a high accuracy.

Figure 6:
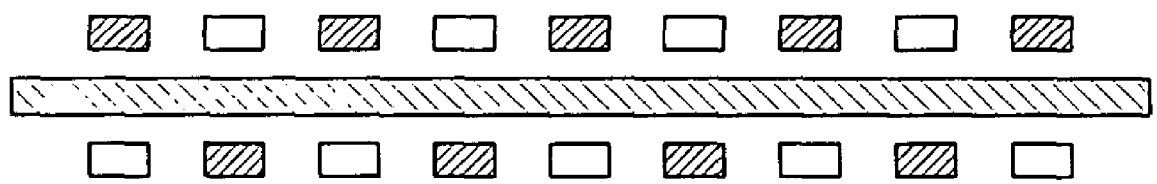
FIG. 6 illustrates a sectional view showing the excitation coil and the flux change detection coil of each axis being formed in zigzag fashion.

FIG. 6 illustrates a sectional view showing a winding pattern of the excitation coil and the pick-up coil of a two-axis fluxgate sensor of FIG. 3 in respective axes. As shown in FIG. 6, the excitation coil and the pick-up coil are respectively wound around the soft magnetic core once in a zigzag fashion such that the excitation coil and the pick-up coil face each other with the intervention of the soft magnetic core therebetween.

A two-axis fluxgate sensor integrated in a PCB as described above may be used in various applications. For example, but not by way of limitation, such a device may be used in a navigation system by terrestrial magnetism detection, an earth magnetism change monitor (earthquake prediction), a biological electric measurement instrument, or a device for detecting defects in metals. As for indirect applications, the fluxgate sensor may also be used in magnetic encoders, contactless potentiometers, electric current sensors, torque sensors, and displacement sensors.

With a two-axis fluxgate sensor according to an embodiment of the present invention, which may be integrated in a PCB together with other sensors and circuits, the overall size of a system may be greatly reduced. Further, power consumption may be minimized.

Even when the two-axis fluxgate sensor is made compact, the two-axis fluxgate sensor according to the present invention has a high sensitivity to detect a weak external magnetic field through the winding structure of the excitation coil and the pick-up coil alternately wound around the rectangular-ring type or two bar-type soft magnetic cores.

A further advantage of the fluxgate sensor according to the present invention is that is may be produced at a lower cost than the conventional bar-type or annular cores. In addition, the fluxgate sensor of the present invention facilitates mass-production.

Further, when the external magnetic field is zero (0), the induction voltages generated from the flux changes within the respective cores due to the excitation coil are offset and detected. As a result, the fluxgate sensor has a high sensitivity to the magnetic field.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A printed circuit board including a dielectric substrate and integrated with a two-axis fluxgate sensor, comprising:
    a first rectangular ring type soft magnetic core arranged lengthwise along a first axial direction;
    a first excitation coil winding around the first soft magnetic core;
    a first pick-up coil winding around the first soft magnetic core;
    a second rectangular ring type soft magnetic core arranged lengthwise along a second axial direction, the second axial direction being perpendicular to the first axial direction;
    a second excitation coil winding around the second soft magnetic core; and
    a second pick-up coil winding around the second soft magnetic core;
    wherein the first soft magnetic core is disposed on a first surface of the dielectric substrate and the second soft magnetic core is disposed on a second surface of the dielectric substrate opposite the first surface.

2. The printed circuit board as claimed in claim 1, wherein:
    the first soft magnetic core comprises a first parallel pair of bar-type portions extending along the first axial direction and a second parallel pair of bar-type portions extending along the second axial direction, the second parallel pair of bar-type portions being co-planar with and connected to the first parallel pair of bar-type portions,
    the second soft magnetic core includes a third parallel pair of bar-type portions extending along the second axial direction and a fourth parallel pair of bar-type portions extending along the first axial direction, the fourth parallel pair of bar-type portions being co-planar with and connected to the third parallel pair of bar-type portions,
    the first and second parallel pairs of bar-type portions of the first soft magnetic core extend along a first plane that is substantially parallel to the dielectric substrate,
    the third and fourth parallel pairs of bar-type portions of the second soft magnetic core extend along a second plane that is substantially parallel to the dielectric substrate, and
    each of the first and second soft magnetic cores serves as a closed magnetic path.

3. The printed circuit board as claimed in claim 2, wherein:
    the first excitation coil separately winds around each bar-type portion of the first parallel pair of bar-type portions of the first soft magnetic core in a solenoid pattern extending along the first axial direction, and
    the second excitation coil separately winds around each bar-type portion of the third parallel pair of bar-type portions of the second soft magnetic core in a solenoid pattern extending along the second axial direction.

4. The printed circuit board as claimed in claim 3, wherein:
    the first pick-up coil winds around both bar-type portions of the first parallel pair of bar-type portions of the first soft magnetic core together in a solenoid pattern extending along the first axial direction, and
    the second pick-up coil winds around both bar-type portions of the third parallel pair of bar-type portions of the second magnetic core together in a solenoid pattern extending along the second axial direction.

5. The printed circuit board as claimed in claim 2, wherein:
    the first excitation coil separately winds around one of the bar-type portions of the first parallel pair of bar-type portions of the first soft magnetic core in a solenoid pattern extending along the first direction and the first pick-up coil separately winds around the other of the bar-type portions of the first parallel pair of bar-type portions of the first soft magnetic core in a solenoid pattern extending along the first axial direction, and
    the second excitation coil separately winds around one of the bar-type portions of the third parallel pair of bar-type portions of the second soft magnetic core in a solenoid pattern extending along the second axial direction and the second pick-up coil separately winds around the other of the bar-type portions of the third parallel pair of bar-type portions of the second soft magnetic core in a solenoid pattern extending along the second axial direction.

6. The printed circuit board as claimed in claim 1, wherein:
the first excitation coil includes a plurality of first excitation coil upper portions on the first surface of the dielectric substrate and a plurality of corresponding first excitation coil lower portions on the first surface of the dielectric substrate, the plurality of first excitation coil upper portions being arranged further from the first surface of the dielectric substrate than the plurality of corresponding first excitation coil lower portions,
the second excitation coil includes a plurality of second excitation coil upper portions on the second surface of the dielectric substrate and a plurality of corresponding second excitation coil lower portions on the second surface of the dielectric substrate, the plurality of second excitation coil upper portions being arranged further from the second surface of the dielectric substrate than the plurality of corresponding second excitation coil lower portions,
the plurality of first excitation coil upper portions correspond to a patterned conductive layer,
the first excitation coil upper portions are electrically connected with corresponding first excitation coil lower portions by conductive vias,
the plurality of second excitation coil upper portions correspond to a patterned conductive layer,
the plurality of corresponding second excitation coil lower portions correspond to a patterned conductive layer, and
the second excitation coil upper portions are electrically connected with corresponding second excitation coil lower portions by conductive vias.

7. The printed circuit board as claimed in claim 6, wherein:
the plurality of first excitation coil upper portions substantially faces the plurality of corresponding first excitation coil lower portions with at least a portion of the first soft magnetic core extending therebetween, and
the plurality of second excitation coil upper portions substantially faces the plurality of corresponding second excitation coil lower portions with at least a portion of the second soft magnetic core extending therebetween.

8. The printed circuit board as claimed in claim 2, wherein:
the first excitation coil alternately winds around each bar-type portion of the first parallel pair of bar-type portions of the first soft magnetic core together in a figure-eight pattern extending along the first axial direction, and
the second excitation coil alternately winds around each bar-type portion of the third parallel pair of bar-type portions of the second soft magnetic core together in a figure eight pattern extending along the second axial direction.

9. The printed circuit board as claimed in claim 8, wherein:
the first pick-up coil winds around both bar-type portions of the first parallel pair of bar-type portions of the first soft magnetic core together in a solenoid pattern extending along the first axial direction, and
the second pick-up coil winds around both bar-type portions of the third parallel pair of bar-type portions of the second magnetic core together in a solenoid pattern extending along the second axial direction.

10. The printed circuit board as claimed in claim 9, wherein:
the first excitation coil and the first pick-up coil wrap around the first soft magnetic core as a single layer,
the second excitation coil and the second pick-up coil wrap around the second soft magnetic core as a single layer,
the winding of the first pick-up coil is off-set in the first axial direction from the winding of the first excitation coil, and
the winding of the second pick-up coil is off-set in the second axial direction from the winding of the second excitation coil.

11. The printed circuit board as claimed in claim 8, wherein:
the first pick-up coil separately winds around each bar-type portion of the first parallel pair of bar-type portions of the first soft magnetic core in a solenoid pattern extending along the first axial direction, and
the second pick-up coil separately winds around each bar-type portion of the third parallel pair of bar-type portions of the second soft magnetic core in a solenoid pattern extending along the second axial direction.

12. The printed circuit board as claimed in claim 11, wherein:
the first excitation coil and the first pick-up coil wrap around the first soft magnetic core as a single layer,
the second excitation coil and the second pick-up coil wrap around the second soft magnetic core as a single layer,
the winding of the first pick-up coil is off-set in the first axial direction from the winding of the first excitation coil, and
the winding of the second pick-up coil is off-set in the second axial direction from the winding of the second excitation coil.

13. The printed circuit board as claimed in claim 1, wherein at least a portion of the dielectric substrate is sandwiched between the first pick-up coil and the second pick-up coil.

14. The printed circuit board as claimed in claim 13, wherein at least a portion of the dielectric substrate is sandwiched between the first excitation coil and the second excitation coil.

15. The printed circuit board as claimed in claim 6, wherein:
the first pick-up coil includes a plurality of first pick-up coil upper portions on the first surface of the dielectric substrate and a plurality of corresponding first pick-up coil lower portions on the first surface of the dielectric substrate, the plurality of first pick-up coil upper portions being arranged further from the first surface of the dielectric substrate than the plurality of corresponding first pick-up coil lower portions,
the second pick-up coil includes a plurality of second pick-up coil upper portions on the second surface of the dielectric substrate and a plurality of corresponding second pick-up coil lower portions on the second surface of the dielectric substrate, the plurality of second pick-up coil upper portions being arranged further from the second surface of the dielectric substrate than the plurality of corresponding second pick-up coil lower portions,
the plurality of first pick-up coil upper portions correspond to a patterned conductive layer, the plurality of corresponding first pick-up coil lower portions correspond to a patterned conductive layer, the first pick-up coil upper portions are electrically connected with corresponding first pick-up coil lower portions by conductive vias, the plurality of second pick-up coil upper portions correspond to a patterned conductive layer, the plurality of corresponding second pick-up coil lower portions correspond to a patterned conductive layer, and the second pick-up coil upper portions are electrically connected with corresponding second pick-up coil lower portions by conductive vias.

16. The printed circuit board as claimed in claim 15, wherein:

the plurality of first excitation coil upper portions and the plurality of first pick-up coil upper portions correspond to a first patterned conductive layer, the plurality of corresponding first excitation coil lower portions and the plurality of corresponding first pick-up coil lower portions correspond to a second patterned conductive layer, the plurality of second excitation coil upper portions and the plurality of second pick-up coil upper portions correspond to a third patterned conductive layer, and the plurality of corresponding second excitation coil lower portions and the plurality of corresponding second pick-up coil lower portions correspond to a fourth patterned conductive layer.

17. The printed circuit board as claimed in claim 15, wherein:

the plurality of first pick-up coil upper portions substantially faces the plurality of corresponding first pick-up coil lower portions with at least a portion of the first soft magnetic core extending therebetween, and the plurality of second pick-up coil upper portions of the second pick up coil substantially faces the plurality of corresponding second pick-up coil lower portions with at least a portion of the second soft magnetic core extending therebetween.

* * * * *